United States Patent
Yan

(10) Patent No.: US 7,083,881 B2
(45) Date of Patent: *Aug. 1, 2006

(54) PHOTOMASKING

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 10/965,072

(22) Filed: Oct. 13, 2004

(65) Prior Publication Data

US 2005/0069789 A1    Mar. 31, 2005

Related U.S. Application Data

(60) Division of application No. 10/389,465, filed on Mar. 13, 2003, now Pat. No. 6,818,361, which is a continuation of application No. 09/430,689, filed on Oct. 29, 1999, now Pat. No. 6,562,522.

(51) Int. Cl.
*G03F 9/00*    (2006.01)

(52) U.S. Cl. .............................. 430/5; 430/30; 716/19

(58) Field of Classification Search ................ 716/19; 430/5, 30

See application file for complete search history.

(56) References Cited

U.S. PATENT DOCUMENTS

| | | | |
|---|---|---|---|
| 5,691,090 A | 11/1997 | Isao et al. | 430/5 |
| 5,939,225 A | 8/1999 | Dove et al. | 430/5 |
| 5,939,227 A * | 8/1999 | Smith | 430/5 |
| 5,945,237 A | 8/1999 | Tanabe | 430/5 |
| 5,958,629 A | 9/1999 | Yan et al. | 430/5 |
| 6,037,083 A * | 3/2000 | Mitsui | 430/5 |
| 6,562,522 B1 * | 5/2003 | Yan | 430/5 |

* cited by examiner

Primary Examiner—Christopher G. Young
(74) Attorney, Agent, or Firm—Fish & Richardson P.C.

(57) ABSTRACT

An attenuated phase-shifting photomask (APSM) provides adjustment of attenuation from mask to mask. The APSM includes a multilayer substrate, a buffer thin film coupled to the substrate, and a top layer thin film on top of the buffer thin film. The thin films are etched with a circuit pattern to form a photomask, and are chosen to have certain thicknesses which would provide adjustment of attenuation within a specified attenuation operating range and appropriate phase shift without changing said buffer thin film and said top layer thin film.

8 Claims, 4 Drawing Sheets

PHOTOMASKING

BACKGROUND

This application is a divisional of U.S. patent application Ser. No. 10/389,465, filed on Mar. 13, 2003 now U.S. Pat. No. 6,818,361, which is a continuation of U.S. application Ser. No. 09/430,689, filed on Oct. 29, 1999, now U.S. Pat. No. 6,562,522; the disclosure of the prior application is considered part of (and is incorporated by reference in) the disclosure of this application.

This disclosure relates to photomasking.

Optical lithography is a technology used to print patterns that define integrated circuits onto semiconductor wafers. Typically, a pattern on an attenuation photomask is imaged by a highly accurate camera. The image is transferred onto a silicon wafer coated with photoresist. Continued improvements in optical lithography have enabled the printing of ever-finer features. This has allowed the integrated circuit industry to produce more powerful and cost-effective semiconductor devices.

A conventional binary mask that controls the amplitude of light incident upon a wafer is often inadequate when the integrated circuit (IC) feature size is small.

Phase-shifting masks can be used for optical lithography for the generation of IC feature sizes below one micron such as 0.25 micron. Under these subwavelength conditions, optical distortions as well as diffusion and loading effects of photosensitive resist and etch processes cause printed line edges to vary. Phase shifting improves the resolution that optical lithography can attain, producing smaller, higher-performance IC features by modulating the projected light at the mask level.

Successors to optical lithography are being developed to further improve the resolution. Extreme-ultraviolet (EUV) lithography is one of the leading successors to optical lithography. It may be viewed as a natural extension, since it uses short wavelength optical radiation to carry out projection imaging. However, EUV lithography (EUVL) technology is different from the technology of optical lithography in that the properties of materials with respect to EUV radiation are different from their properties with respect to visible and UV ranges. For example, the EUV radiation is strongly absorbed in virtually all materials, including gas. Thus, EUVL imaging systems often utilize entirely reflective optical elements rather than refractive elements, such as lenses.

SUMMARY

A photomasking technique provides adjustment of attenuation from mask to mask within a specified attenuation operating range and appropriate phase shift without changing the material of thin film layers disposed on a substrate.

The photomask includes a substrate, a first film coupled to the substrate, and an upper layer film on top of the first film. The first film has a first thickness of a particular material. The upper layer film has a second thickness of another material. The films are etched with a circuit pattern to form a photomask, and are chosen to have certain thicknesses which would provide adjustment of attenuation within a specified attenuation operating range and appropriate phase shift without changing the material of the first film and the upper layer thin film. In one embodiment, the specified attenuation operating range is about 6% to 20% attenuation.

BRIEF DESCRIPTION OF THE DRAWINGS

These and other aspects will be described in reference to the accompanying drawings wherein.

DETAILED DESCRIPTION

Figure 1A:
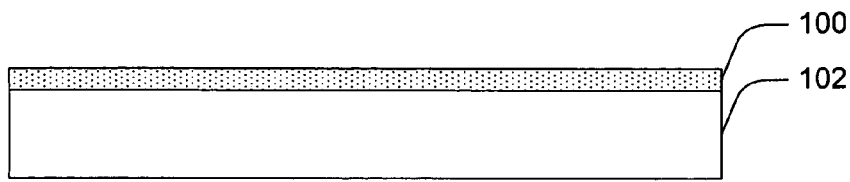
FIGS. 1A through 1E show a fabrication process flow for a conventional binary photomask.
Figure 1B:
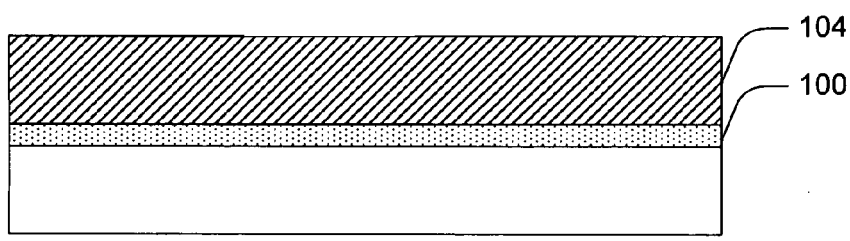
Figure 1C:
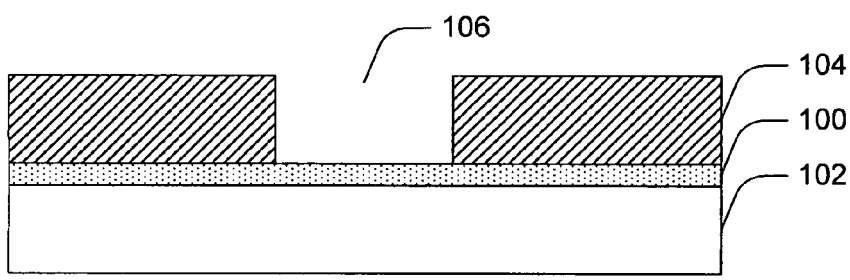
Figure 1D:
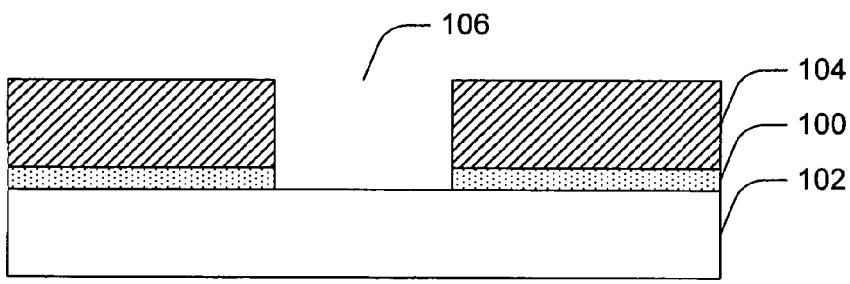

A conventional binary photomask can be made with a layer of chrome 100 deposited on a quartz or glass substrate 102 as shown in FIG. 1A. The chrome is covered with a photosensitive resist 104 (FIG. 1B). A beam writer then writes the circuit pattern onto the photomask by exposing the photosensitive resist with an electron beam or laser, which changes the molecular composition of the resist 104. During the developing process, any positive resist that has been exposed 106 will be removed as shown in FIG. 1C. In an alternative embodiment, the process can be performed with a negative resist, which removes the non-exposed area. Next, the mask is etched in a process that removes the chrome 100 from the area where the resist has been removed 106 (FIG. 1D). Finally, FIG. 1E shows all the resist removed from the photomask 108.

Figure 1E:
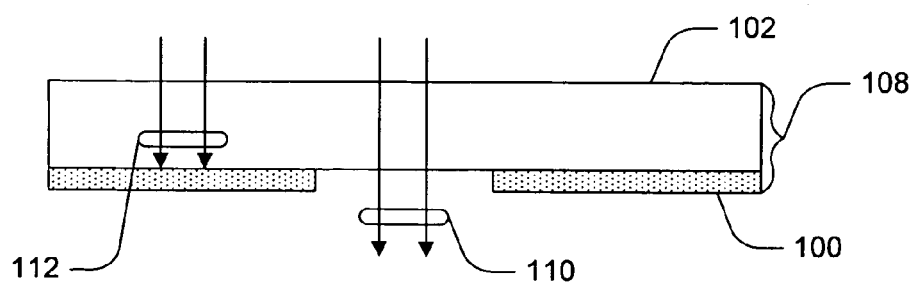

The photomask 108, shown in FIG. 1E, is used in much the same way that a photographic positive is used to make a photograph. A beam of light projects the image patterned on the photomask 108, several times, side by side, onto small areas called "dice" on a silicon wafer. Areas where the chrome has been removed pass the beam of light 110 through without any attenuation. The remaining areas attenuate the light 112 and create dark spots on the wafer.

An attenuated phase-shifting mask (APSM), which combines attenuation with a phase-shifting technique, is fabricated by replacing the chrome absorber layer 100 with a synthesized material. The material is synthesized at a given thickness to meet both phase shift and attenuation requirements. The patterning of such an APSM mask is similar to that of a conventional optical mask, but uses a different absorber material. This difference requires a different etch process. The achievable attenuation range is very narrow because of the limitation of available material. For example, it is difficult to achieve attenuation on the order of about 10 to 15%, which offers better performance for certain mask layers than the case of traditional 6% attenuation. Therefore, a change of attenuation for different mask layers means a change of absorber material, and hence, an imposition of new process development which involves new film selection, deposition, etch, and cleaning parameters for each layer of absorber material.

An APSM process for extreme-ultraviolet (EUV) lithography involves choosing a single material, for use at an EUV wavelength (13.4 nm), which matches both the phase-shift and the attenuation requirements. This task is difficult to achieve because a different range of attenuation is often required for different applications. The difficulty is compounded by the high absorption characteristic of condensed material at 13.4 nm, and very little difference in the refractive index between the absorber and vacuum, which determines the phase difference between the attenuated region and the reflective region.

Figure 2A:
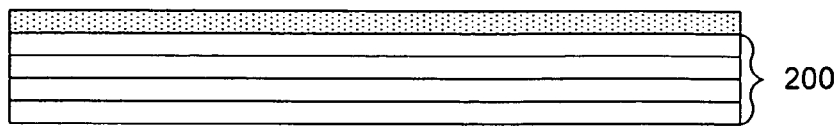
FIGS. 2A through 2E show a fabrication process flow for an extreme-ultraviolet (EUV) attenuated phase-shifting mask (APSM) according to an embodiment of the invention.
Figure 2B:
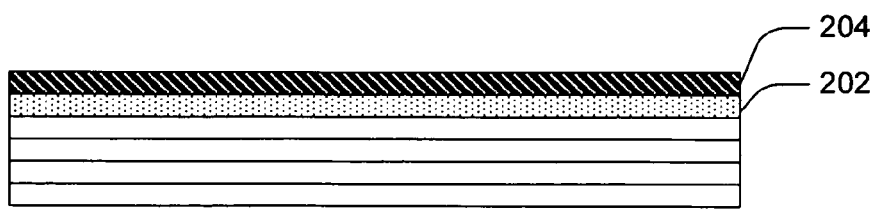
Figure 2C:
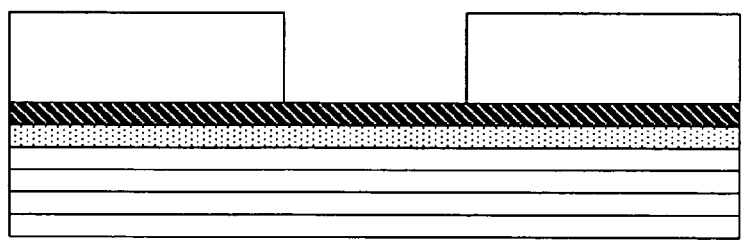
Figure 2D:
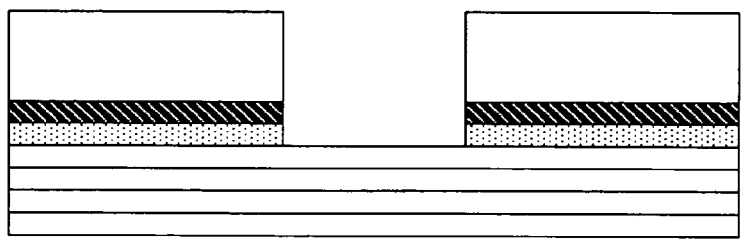
Figure 2E:
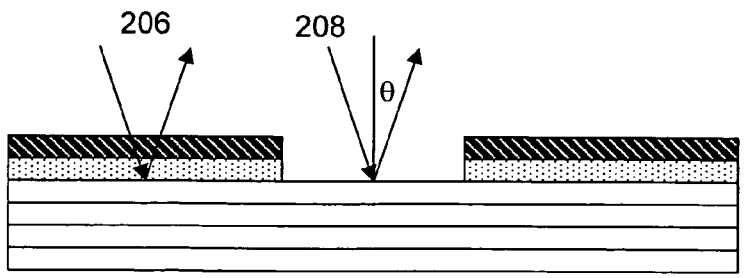

FIGS. 2A through 2E show an improved fabrication process flow for an EUV APSM. The process starts with a multi-layer substrate 200 (FIG. 2A). In some embodiments, the substrate includes silicon, ultra-low expansion material, etc. This is followed by the deposition of first 202 and second 204 thin film layers (FIG. 2B). In some embodiments, the second thin film layer 204 comprises at least one layer of thin film disposed on top of the first thin film layer 202. FIGS. 2C through 2E illustrate the rest of the process, which includes resist coating and patterning (FIG. 2C), consecutive etching of the top and bottom thin-film layers (FIG. 2D), and stripping of the resist (FIG. 2E). The resultant APSM provides appropriate attenuation and 180-degree phase shift where the thin-film layers remain 206 and no attenuation and zero phase-shift where the layers have been stripped 208.

Figure 3A:
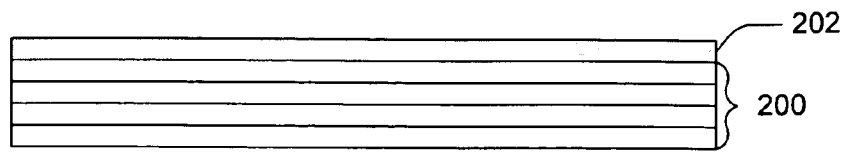
FIGS. 3A through 3F show a process flow for the inspection and repair of the EUV APSM according to an embodiment of the invention.
Figure 3B:
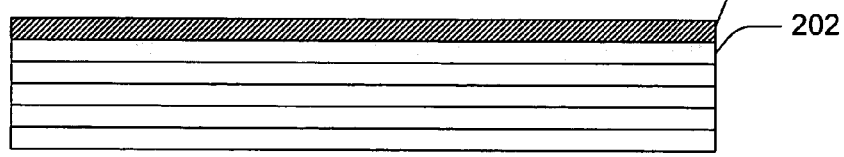
Figure 3C:
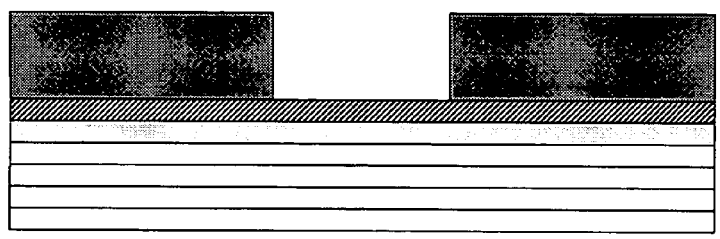

In one embodiment, an inspection and repair process follows the top layer etching. The process flow for the inspection and repair of the EUV APSM is shown in FIGS. 3A through 3F. The process starts with a multi-layer substrate 200, as before. The first thin-film layer 202, which acts as a buffer layer, is then deposited as shown in FIG. 3A. This is followed by the deposition of the second layer film 204 (FIG. 3B) and the resist coating and patterning (FIG. 3C).

Figure 3D:
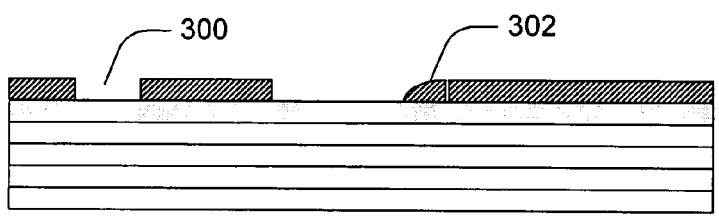
Figure 3E:
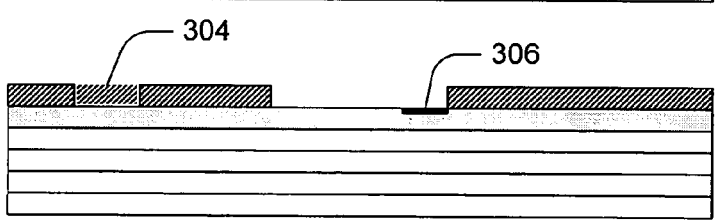
Figure 3F:
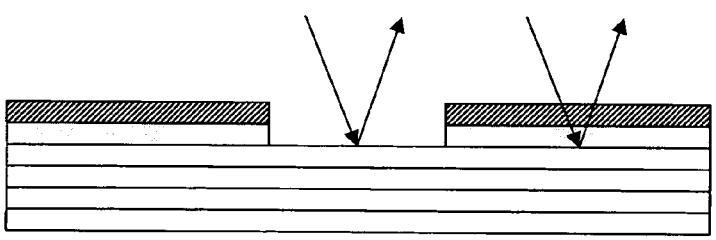

The repair process starts after the top layer 204 thin film etching and resist removal has been completed, as shown in FIG. 3D. The top layer 204 has been etched using the bottom layer 202 as the etch stop buffer layer. Once the top layer etching is done, the thin film is inspected for defects. FIG. 3D shows two defects 300, 302 typically found during inspection. Filling the gap 304 with same material as the top layer film repairs the defect 300. Chipping away the leftover blob repairs the defect 302 (FIG. 3E). Finally the bottom layer is etched to produce an EUV APSM as shown in FIG. 3F.

The selection of the type and thickness for each thin-film layer 202, 204 should satisfy the following conditions as follows:

$$I \approx I_o |\exp[-(2\pi/\lambda)(2\alpha_1 d_1 + 2\alpha_2 d_2)]|^2, \quad (1)$$

$$|(2\pi/\lambda)(2\Delta n_1 d_1 + 2\Delta n_2 d_2)| = \pi, \quad (2)$$

where $I_o$ is the incident light intensity,

I is the light intensity reflected from the absorber region (round-trip reflection), $\lambda$ is the wavelength of the light, $\alpha_1$ and $\alpha_2$ are absorption coefficients of films 1 and 2, respectively, $d_1$ and $d_2$ are thicknesses of films 1 and 2, respectively, $n_1$ and $n_2$ are indices of refraction (real part) of films 1 and 2, respectively, for small incident angle, $\theta$, which is an angle between the incident light and the normal to the surface. For larger $\theta$, n1 and n2 must take into consideration cos ($\theta$) contributions.

The EUV mask attenuation for a given thickness of a given film is governed by the absorption coefficient $\alpha$ and the film thickness d. The attenuation of the beam in the absorber region after a round-trip reflection from the multi-layer substrate 200 is, in the first order approximation, given by equation (1). Both the film thickness and the real part of the refractive index difference between the absorber material and vacuum govern the phase shift of an absorber. The reflected light from thin film to thin film and thin film to vacuum interfaces (on the order of about 0.01% to 0.02%) are ignored in equation (1) because the real parts of the refractive indices are closely matched at EUV wavelength.

Since an APSM with a $\pi$ phase shift satisfies equation (2), equations (1) and (2) can be solved for $d_1$ and $d_2$ as follows:

$$d_1 = \left[-\lambda(1-n_1)\ln\left(\frac{I}{I_o}\right)\Big/(8\pi) + \frac{\lambda\alpha_1}{4}\right]\Big/[(1-n_1)\alpha_2 - (1-n_2)\alpha_1], \quad (3)$$

$$d_2 = \left[-\lambda(1-n_2)\ln\left(\frac{I}{I_o}\right)\Big/(8\pi) + \frac{\lambda\alpha_2}{4}\right]\Big/[(1-n_2)\alpha_1 - (1-n_1)\alpha_2]. \quad (4)$$

Therefore, any combination of two films with index of refraction that satisfies equations (3) and (4) can be used. The value of $d_1$ or $d_2$ must be a positive number. In practice, however, the film selection also needs to consider the process compatibility, etch selectivity of the two films, and the proper film thickness ratio. The film thickness ratio should be configured to satisfy the minimum repair buffer layer thickness.

Examples of the two thin film layer selection are shown in Table 1 below for an attenuation operating range of 6% to 15%. The desired attenuation from about 10% to 15% can be achieved by adjusting the thickness of the two film layers without changing the material of each film. The ability to adjust attenuation without a change in the thin film type enables the same deposition and etch processes in the manufacturing of the thin-film layers. Only the deposition and etching time need to be adjusted to accommodate the film thickness change.

| Attenuation % | Buffer Layer Type | Buffer Layer Thickness ($d_1$) [in Å] | Top Layer Type | Top Layer Thickness ($d_2$) [in Å] |
|---|---|---|---|---|
| 6 | $SiO_2$ | 854 | Ti | 373 |
| 7 | $SiO_2$ | 564 | Ti | 506 |
| 7 | $SiO_2$ | 766 | TiN | 304 |
| 8 | $SiO_2$ | 312 | Ti | 621 |
| 8 | $SiO_2$ | 560 | TiN | 372 |
| 9 | $SiO_2$ | 378 | TiN | 433 |
| 10 | $SiO_2$ | 218 | TiN | 488 |
| 10 | $SiO_2$ | 1082 | Mo | 167 |
| 11 | $SiO_2$ | 1022 | Mo | 184 |
| 12 | $SiO_2$ | 968 | Mo | 200 |
| 13 | $SiO_2$ | 918 | Mo | 214 |
| 14 | $SiO_2$ | 872 | Mo | 227 |
| 15 | $SiO_2$ | 828 | Mo | 239 |

Some of the advantages of the EUV APSM and the fabrication process are the ability to adjust the desired attenuation without changing the manufacturing process of the thin film layers in the EUV APSM and the consistency of the two-layer absorber process with the current state-of-art EUV mask process flow. Further, the process is consistent with the current state-of-art EUV mask process flow, as well as repair strategy, that comprises a buffer layer and a metal layer with a buffer layer being used to absorb the repair damage.

Figure 4:
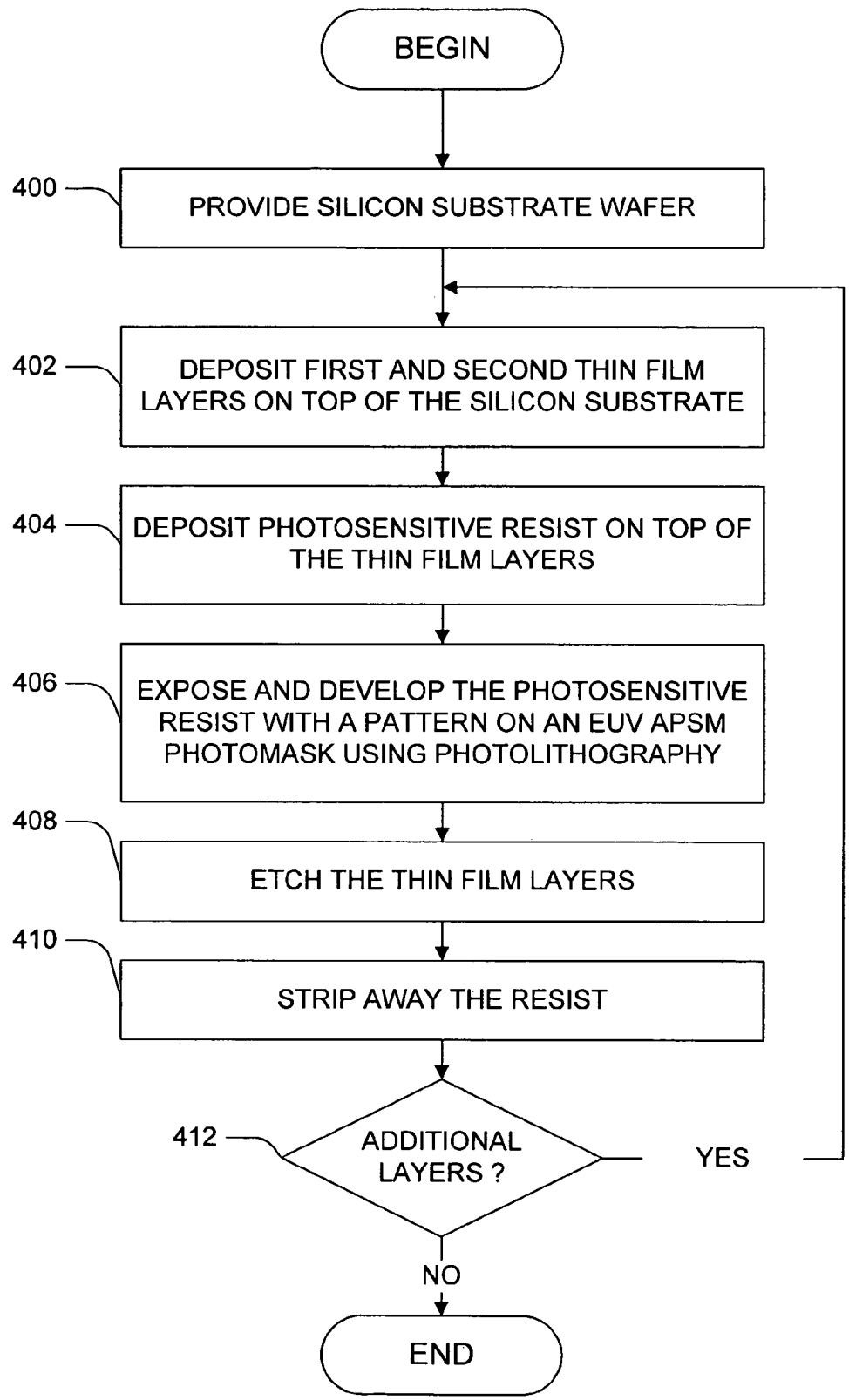
FIG. 4 shows a process flow diagram for fabricating an integrated-circuit wafer according to an embodiment of the invention.

FIG. 4 shows a process flow diagram for fabricating an integrated-circuit wafer. The process begins by providing a substrate, at step 400. First and second thin film layers are then deposited on top of the substrate (step 402). The first and second thin film layers have first and second thicknesses determined by equations (3) and (4), respectively. At step 404, a photosensitive resist is deposited on top of the conducting material. Next, the resist is exposed and developed with a pattern on an EUV APSM, at step 406. The APSM used in this step is fabricated using the above-described method. Finally, the conducting material is etched (step 408) and the resist is stripped away (step 410). If additional layer is to be patterned, the process is repeated at step 402.

An apparatus that execute above-specified process is also disclosed. The apparatus comprises a machine-readable storage medium having executable instructions that enable the machine to perform the steps in the specified process.

Other embodiments are within the scope of the following claims. For example, the fabrication process for the EUV APSM described above can also be used for an optical APSM. In this case, equations (3) and (4) need to be modified to include interface reflections due to non-matched real part of the reflective index at optical wavelengths.

What is claimed is:

1. An article comprising a machine-readable medium storing instructions operable to cause one or more machines to perform operations comprising:
   receiving information indicative of one or more optical characteristics of a particular material;
   receiving information indicative of one or more optical characteristics of another material;
   receiving information indicative of a desired attenuation amount;
   receiving information indicative of a desired phase amount; and
   using the information indicative of the one or more optical characteristics of the particular material and the another material, the information indicative of the desired attenuation amount, and the information indicative of the desired phase amount for determining a first thickness of the particular material and a second thickness of the another material to attenuate light of a particular wavelength by the desired attenuation amount as the light is transmitted through the particular material and the another material in a forward direction and in a reflected direction, the first thickness of the particular material and the second thickness of the another material to shift a phase of the light by the desired phase amount as the light is transmitted through the particular material and the another material in the forward direction and in the reflected direction.

2. The article of claim 1, wherein the another material comprises tungsten, and wherein the desired attenuation is between about 6% and about 10%.

3. The article of claim 1, wherein the another material comprises molybdenum, and wherein the desired attenuation is between about 10% and about 15%.

4. The article of claim 1, wherein the information indicative of one or more optical characteristics of the particular material comprises an absorption coefficient of the particular material and an index of refraction of the particular material, wherein the information indicative of one or more optical characteristics of the another material comprises an absorption coefficient of the another material and an index of refraction of the another material, and wherein the first thickness is represented by $d_1$, the second thickness is represented by $d_2$, the particular wavelength is represented by $\lambda$, the absorption coefficient of the material is represented by $\alpha_1$, the absorption coefficient of the another material is represented by $\alpha_2$, the index of refraction of the material is represented by $n_1$, the index of refraction of the another material is represented by $n_2$, and the ratio of an initial intensity of the light to an exiting intensity of the light is represented by $I/I_0$, and wherein $d_1$ and $d_2$ are about equal to:

$$d_1 = \left[-\lambda(1-n_1)\ln\left(\frac{I}{I_o}\right)\Big/(8\pi) + \frac{\lambda\alpha_1}{4}\right]\Big/[(1-n_1)\alpha_2 - (1-n_2)\alpha_1],$$

$$d_2 = \left[-\lambda(1-n_2)\ln\left(\frac{I}{I_o}\right)\Big/(8\pi) + \frac{\lambda\alpha_2}{4}\right]\Big/[(1-n_2)\alpha_1 - (1-n_1)\alpha_2].$$

5. The article of claim 1, wherein the particular wavelength is an extreme ultraviolet light wavelength.

6. The article of claim 1, further comprising:
   receiving information indicative of a different desired attenuation amount; and
   determining a different first thickness of the particular material using the information indicative of the one or more optical characteristics of the particular material and the another material, the information indicative of the different desired attention amount, and information indicative of at least one of the desired phase amount and a different phase amount.

7. The article of claim 1, further comprising:
   receiving information indicative of a different desired phase amount; and
   determining a different first thickness of the particular material using the information indicative of the one or more optical characteristics of the particular material and the another material, the information indicative of the different desired phase amount, and information indicative of at least one of the desired attenuation amount and a different attenuation amount.

8. The article of claim 1, further comprising:
   receiving information indicative of a different desired attenuation amount and a different desired phase amount; and
   determining a different first thickness of the particular material using the information indicative of the one or more optical characteristics of the particular material and the another material, the information indicative of the different desired phase amount, and the information indicative of the different attenuation amount.

* * * * *